(12) United States Patent
Low

(10) Patent No.: US 7,544,958 B2
(45) Date of Patent: Jun. 9, 2009

(54) CONTAMINATION REDUCTION DURING ION IMPLANTATION

(75) Inventor: Russell John Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 257 days.

(21) Appl. No.: 11/728,020

(22) Filed: Mar. 23, 2007

(65) Prior Publication Data

US 2008/0230724 A1    Sep. 25, 2008

(51) Int. Cl.
  *H01J 37/317* (2006.01)
(52) U.S. Cl. .................. 250/492.21; 250/398
(58) Field of Classification Search ........... 250/492.21, 250/398
  See application file for complete search history.

(56) References Cited

U.S. PATENT DOCUMENTS

| | | | | |
|---|---|---|---|---|
| 5,719,403 A | * | 2/1998 | Purser | 250/492.21 |
| 5,945,682 A | * | 8/1999 | Oh et al. | 250/492.21 |
| 2002/0088944 A1 | * | 7/2002 | LaFontaine et al. | 250/423 R |

* cited by examiner

*Primary Examiner*—Kiet T Nguyen

(57) ABSTRACT

A method includes generating an ion beam having ions at a first charge state, accelerating the ions at the first charge state to a final energy, altering the first charge state to a second charge state for some of said ions, the second charge state less than the first charge state, providing an ion beam having ions at the second charge state and parasitic beamlets having ions at a charge state different than the second charge state, directing the ion beam having ions at the second charge state towards a wafer, and directing the parasitic beamlets away from the wafer. An ion implanter having a charge exchange apparatus is also provided.

17 Claims, 5 Drawing Sheets

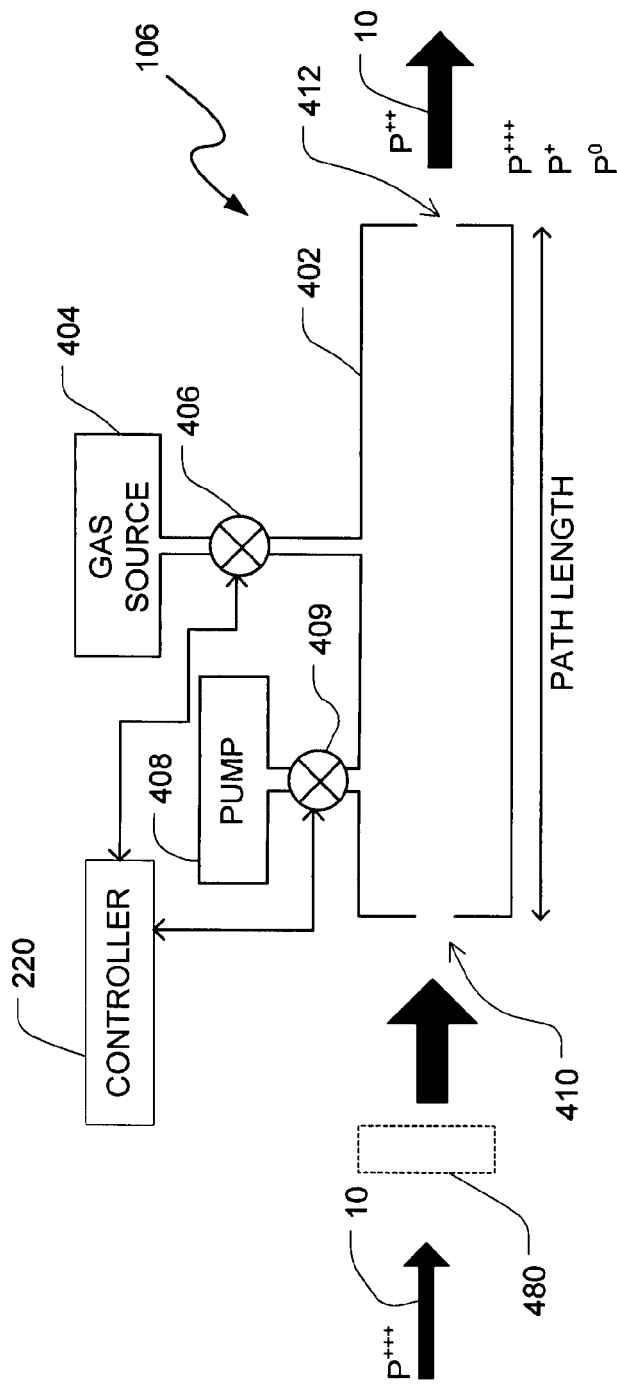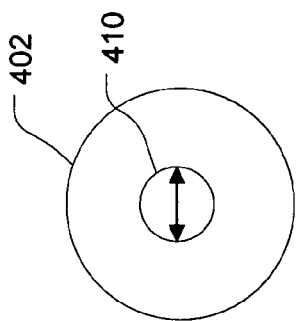

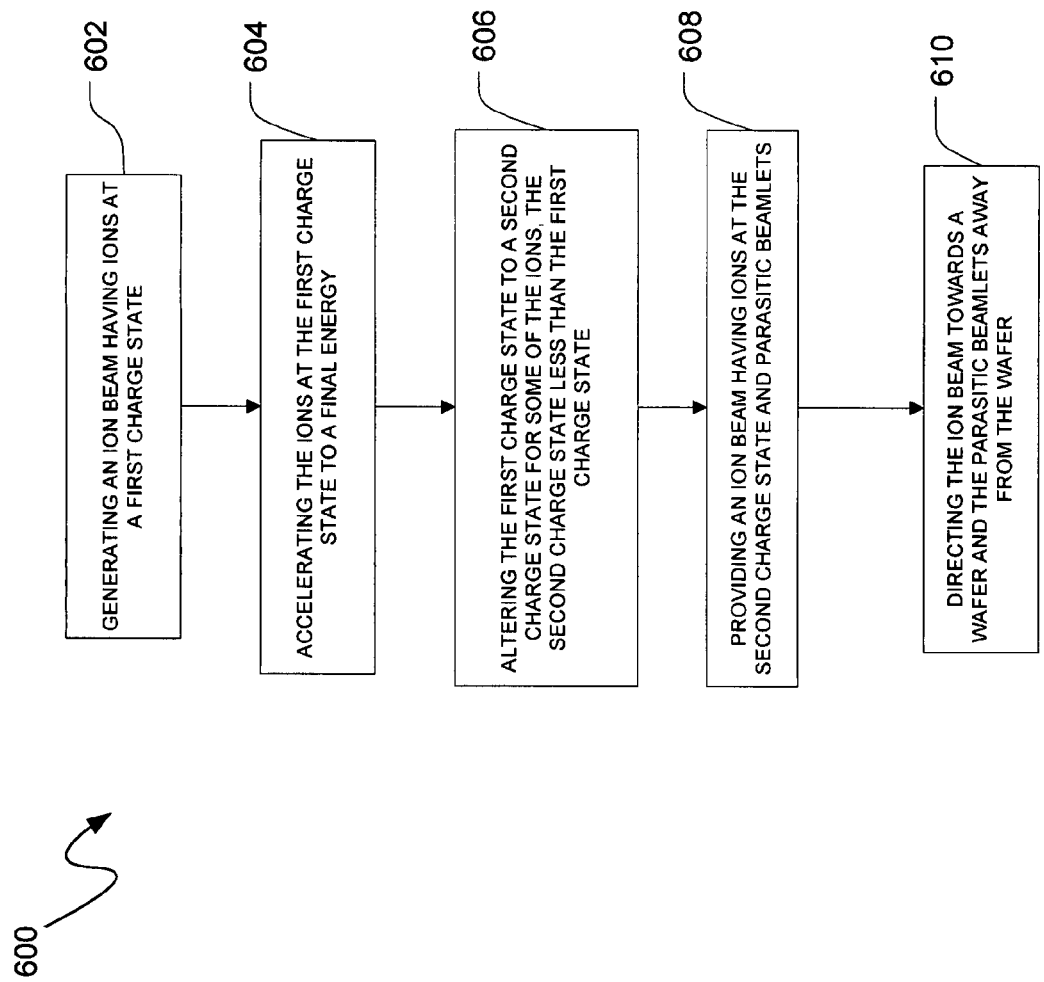

CONTAMINATION REDUCTION DURING ION IMPLANTATION

FIELD

This disclosure relates to ion implantation, and more particularly to contamination reduction during ion implantation.

BACKGROUND

Ion implantation is a standard technique for introducing conductivity—altering impurities into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material. The ion beam may be distributed over the wafer area by beam scanning, by wafer movement, or by a combination of beam scanning and wafer movement.

Differing kinetic energy may be imparted to the ions of the ion beam. The imparted energy, as well as other factors such as the mass of the implanting ions, may affect the implanted depth of the ions into the semiconductor wafer. In general, a lower energy would result in a shallower implant depth and a higher energy would result in a deeper implant depth with all other parameters equal. A higher kinetic energy may be considered energy greater than about 1,000 kiloelectronvolts (keV) or 1 MeV.

An energy range of an ion implanter may be extended by producing and transporting multiply charged ions since the kinetic energy of the ions is equal to the charge state multiplied by a potential difference through which the ions pass. For example, a potential difference of 400 kilovolts (kV) provides up to 400 keV of energy for singly charged ions, 800 keV for doubly charged ions, and 1,200 keV (or 1.2 MeV) for triply charged ions. Therefore, for the same potential difference, a higher energy is achieved with multiply charged ions.

However, a drawback of multiply charged ions is that undesired charge exchanges of ions may result in contamination that is difficult to filter before it reaches the target wafer. For instance, in an ion implanter having a scanner to scan a spot beam and an angle corrector magnet positioned downstream of the scanner to collimate the scanned ion beam, any contamination occurring before the angle corrector magnet may not be able to be sufficiently deflected by the angle corrector magnet away from the target wafer before some contamination ions strike the wafer. In one example, triply charged phosphorous ions ($P^{+++}$) may be desired for implantation into a target wafer. Contamination upstream of the angle corrector magnet may cause the $P^{+++}$ ions to gain or lose a positive charge, introducing parasitic beamlets of $P^{++++}$ and $P^{++}$ contamination ions respectively. As used herein, a "parasitic beamlet" is a beamlet formed by streams of charge-altered ions having a charge state different than the desired charge state. Compared to the $P^{+++}$ ions, the $P^{++++}$ ions will be bent more by the magnetic field of the angle corrector magnet and the $P^{++}$ ions will be bent less by the magnetic field of the angle corrector magnet. Unfortunately, some of the $P^{++}$ contamination ions input to the corrector magnet would still strike the target wafer. The $P^{++}$ contamination ions that strike the wafer would do so at unintended incident angles and can therefore adversely affect the dopant profile in the target wafer. In addition, the $P^{++}$ contamination ions can also adversely affect the dose uniformity of implanted ions since a typical dosimetry system assumes ions have a desired known charge state. In addition, the uniformity of the ion beam can be disturbed by undesired charge exchanges. For instance, the ion beam may be initially set up in low vacuum conditions. During ion implantation in a high vacuum condition, the pressure may change due to gas evolving from the wafer and the beam uniformity may be disrupted by the redistribution of beamlets.

Two conventional solutions to lessen the amount of contamination ions striking the target wafer are to increase the dispersion angle of the scanner and the angle corrector magnet and/or to increase the drift length downstream of the angle corrector magnet by positioning the target wafer further from the angle corrector magnet. This would allow the contamination ions to sufficiently separate from the desired ions before reaching the target wafer. However, both of these solutions would require the ion implanter to increase its size considerably, which is typically not practical in a manufacturing facility where space is costly and/or unavailable.

Accordingly, there is a need to provide techniques for reducing contamination during ion implantation which overcomes the above-described inadequacies and shortcomings.

SUMMARY

According to a first aspect of the invention, an ion implanter is provided. The ion implanter includes an ion source configured to generate an ion beam having ions at a first charge state, an accelerator configured to accelerate the ions at the first charge state to a final energy, and a charge exchange apparatus positioned downstream of the accelerator. The charge exchange apparatus is configured to accept the ion beam and to alter the first charge state to a second charge state for some of the ions, the second charge state less than the first charge state. The charge exchange apparatus is further configured to provide the ion beam having ions at the second charge state and parasitic beamlets having ions at a charge state different than the second charge state. The ion implanter further includes a deflector positioned downstream of the charge exchange apparatus. The deflector is configured to direct the ion beam having ions at the second charge state towards a wafer and to direct the parasitic beamlets away from the wafer.

According to another aspect of the invention, a method is provided. The method includes: generating an ion beam having ions at a first charge state; accelerating the ions at the first charge state to a final energy; altering the first charge state to a second charge state for some of the ions, the second charge state less than the first charge state; providing an ion beam having ions at the second charge state and parasitic beamlets having ions at a charge state different than the second charge state; directing the ion beam having ions at the second charge state towards a wafer; and directing the parasitic beamlets away from the wafer.

BRIEF DESCRIPTION OF THE DRAWINGS

For a better understanding of the present disclosure, reference is made to the accompanying drawings, in which like elements are referenced with like numerals, and in which:

FIG. 4 is a block diagram of a charge exchange apparatus consistent with an embodiment of the disclosure;

FIG. 5 is an end view of the charge exchange apparatus of FIG. 4; and

FIG. 6 is a flow chart of operations consistent with an embodiment of the disclosure.

DETAILED DESCRIPTION

Figure 1:
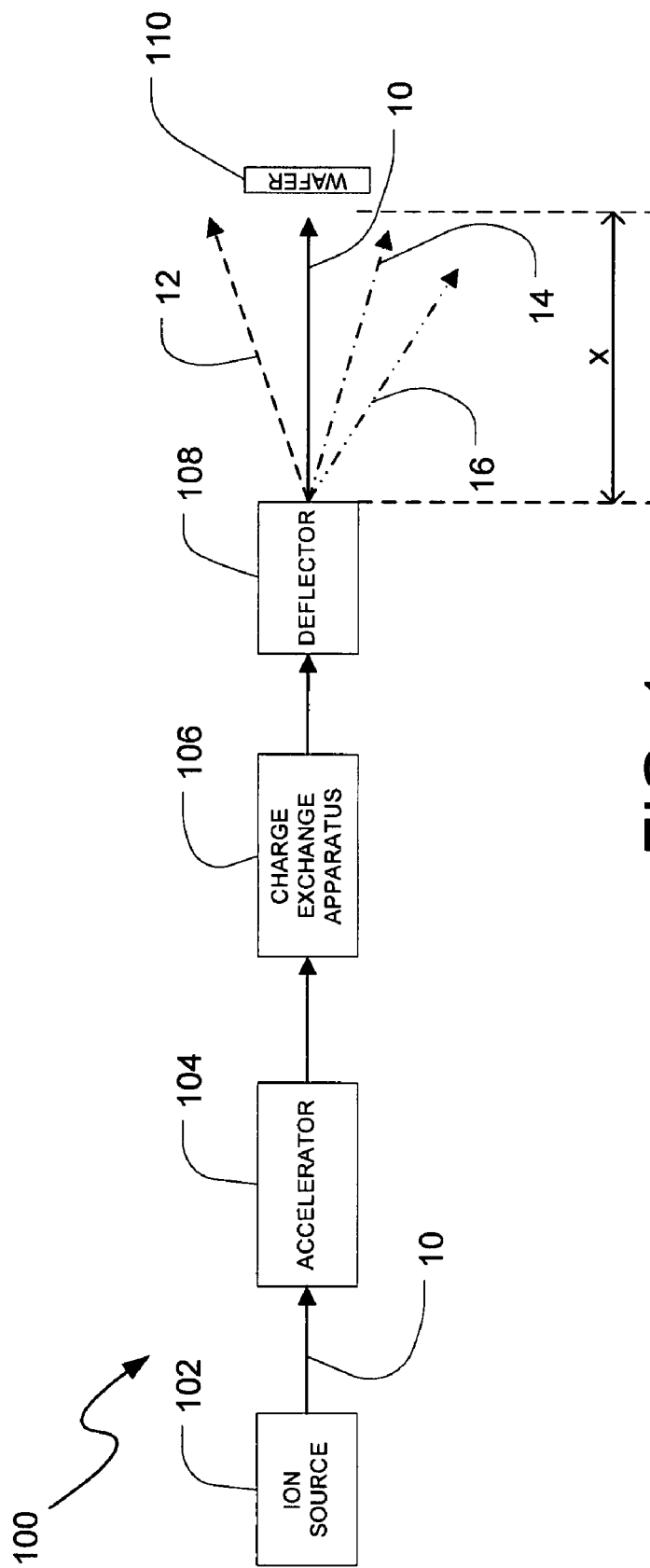
FIG. 1 is a block diagram of an ion implanter consistent with an embodiment of the disclosure.

FIG. 1 illustrates a simplified block diagram of an ion implanter 100 consistent with an embodiment of the disclosure. The ion implanter 100 may include an ion source 102, an accelerator 104, a charge exchange apparatus 106, a deflector 108, and a target wafer 110. The ion source 102 can include various types of components and systems to generate an ion beam 10 having ions at a first charge state. The first charge state may be a multiply charged state including, but not limited to, a triply or doubly charged state. The ion source 102 may be a specifically designed ion source to produce an ion beam having multiply charged ions. Alternatively, a conventional ion source such as Bemas source or indirectly heated cathode (IHC) source as are known in the art could be operated to produce an ion beam having multiply charged ions. For example, the IHC source may be run at a higher arc voltage level, the gas pressure of the chamber of the IHC source may be decreased, and the magnetic field affecting electron flight in the chamber of the IHC source may be increased to increase the probability of creating more multiply charge ions. In one example, $P^{+++}$ ions may be generated by the ion source 102.

The accelerator 104 is configured to accelerate ions of the ion beam 10 to a final energy. As is known in the art, the accelerator 104 can provide a potential difference for acceleration of the ions of the ion beam 10 to a final energy. For example, a potential difference of 400 kV can provide up to 1.2 MeV for triply charged ions. Therefore, the use of multiply charged ions can provide for higher energy levels given the same maximum potential difference provided by the accelerator 104. In one instance, the accelerator 104 may include a terminal structure forming a cavity in which the ion source is positioned. One or more power supplies may be coupled to the terminal structure to energize the terminal structure to a desired potential.

A charge exchange apparatus 106 is positioned downstream of the accelerator 104. As used herein, "downstream" and "upstream" are referenced in the direction of ion beam transport. The charge exchange apparatus 106 is configured to accept the ion beam 10 and to alter the multiply charged state of some ions to a lower charge state. The charge exchange apparatus 106 also provides parasitic beamlets having ions at a charge state different than the desired charge state. For example, if $P^{+++}$ ions are generated by the ion source 102 and the desired output charge state of the charge exchange apparatus is $P^{++}$, the charge exchange apparatus may also output parasitic beamlets of $P^{+++}$, $P^+$, and $P^0$. The deflector 108 positioned downstream of the charge exchange apparatus 106 is configured to direct the ion beam having ions of the desired charge state towards the wafer 110, while deflecting parasitic beamlets 12, 14, 16 away from the target. The wafer 110 may be positioned a distance "x" downstream from the deflector 108 so the parasitic beamlets 12, 14, 16 do not strike any portion of the front surface of the wafer 110. In one embodiment, the deflector 108 may be an angle corrector magnet as further detailed in FIGS. 2 and 3. Alternatively, the deflector 108 may be a filter such as an electrostatic filter or magnetic filter as are known in the art to direct parasitic beamlets 12, 14, 16 away from the target wafer 110. The ion implanter 100 can therefore provide high energy ion beams while also controlling contamination by deflecting parasitic beamlets 12, 14, 16 away from the target wafer 110.

Figure 2:
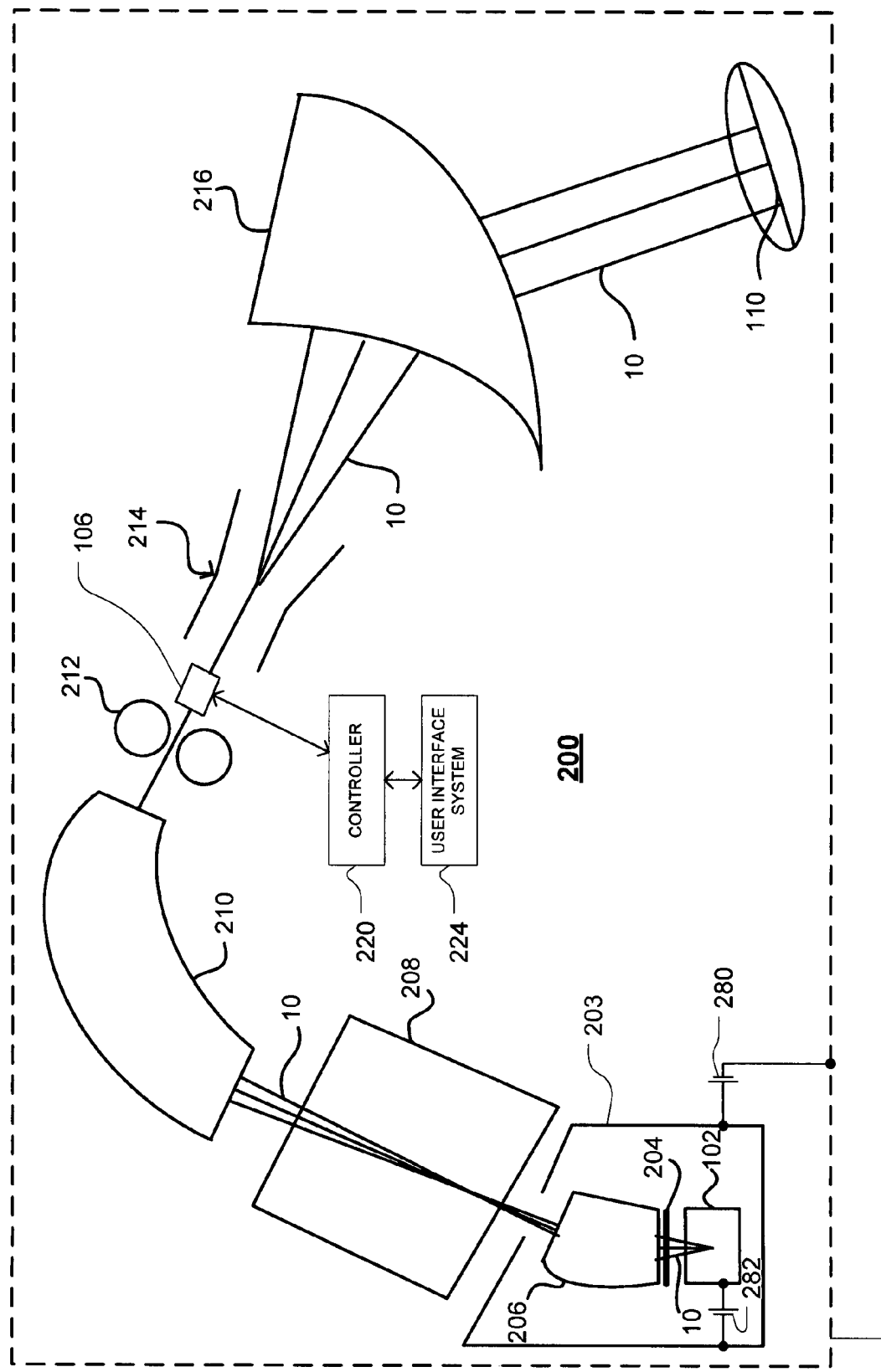
FIG. 2 is a schematic block diagram of another embodiment of an ion implanter consistent with an embodiment of the disclosure.
Figure 3:
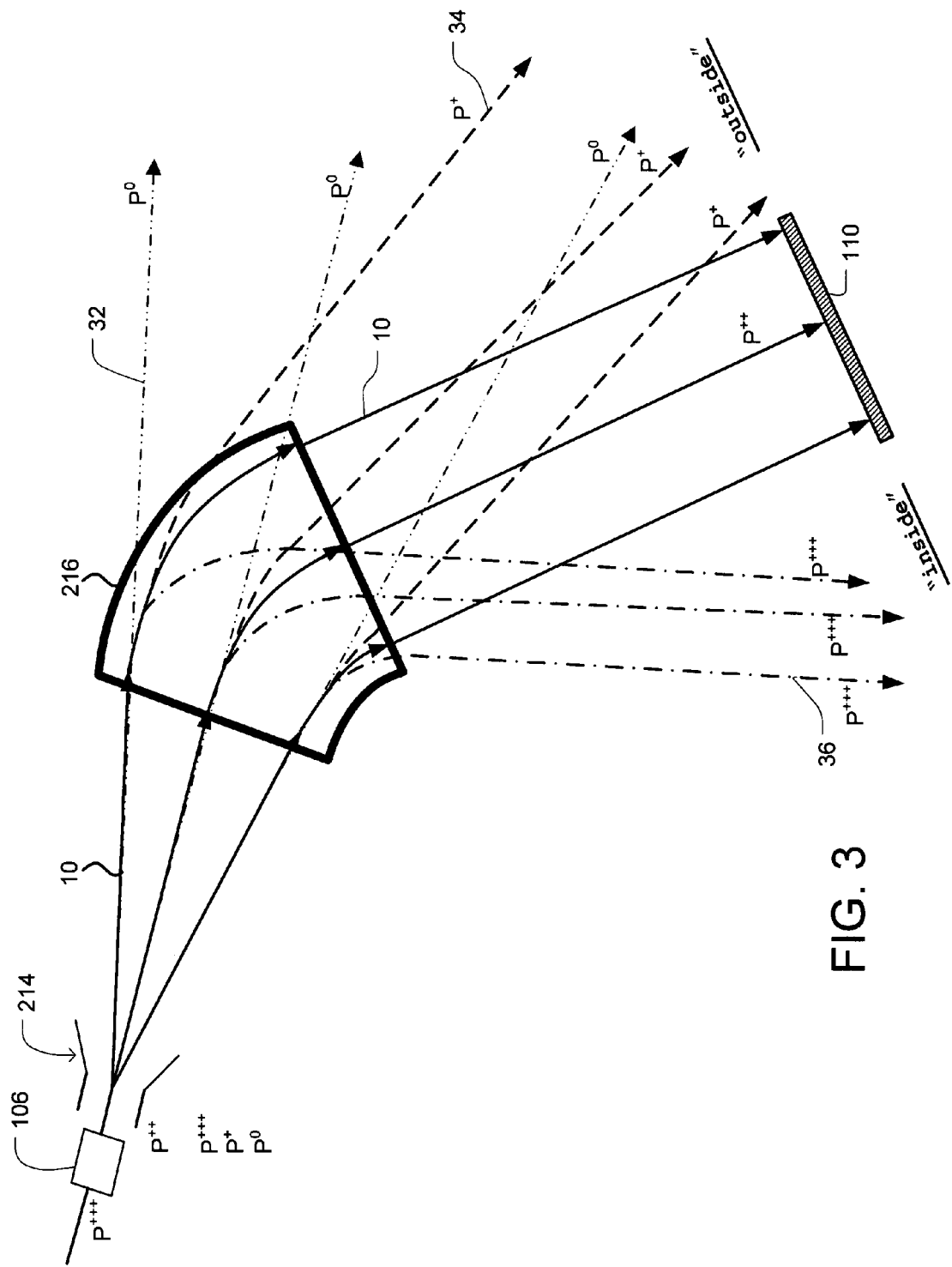
FIG. 3 illustrates ion trajectories of ions through the angle corrector magnet of FIG. 2.

Turning to FIG. 2 in conjunction with FIG. 3, another embodiment of an ion implanter 200 consistent with an embodiment of the disclosure is illustrated. Similar components of FIGS. 2 and 1 are similarly labeled and hence any repetitive description is omitted. The ion implanter 200 may include a series of beamline components such as the ion source 102, an extraction manipulator 204, a filter magnet 206, and acceleration or deceleration column 208, a mass analyzer 210, a rotating mass slit 212, the charge exchange apparatus 106, a scanner 214, an angle corrector magnet 216 functioning as the deflector 108 of FIG. 1, a controller 220, and a user interface system 224. The ion implanter components can filter and focus the ion beam 10 before steering it towards the target wafer 110. The target wafer 110 is typically housed in a wafer end-station (not shown) under high vacuum. A high vacuum condition may also be maintained inside different components of the ion implanter so that the ion beam travels in a high vacuum environment.

The ion source 102 may be positioned in a cavity defined by the terminal structure 203 which may sometimes be referred to in the art as a "terminal" or a "high voltage terminal." The acceleration/deceleration column 208 and/or the terminal structure 203 and associated power supplies such as the extraction power supply 282 and the acceleration power supply 280 may provide a potential difference to accelerate ions of the ion beam 10 to a final energy. The acceleration/deceleration column 208 may include a plurality of electrodes coupled to various power supplies to accelerate and focus ions of the ion beam 10 as known to those skilled in the art. Alternatively, a chain of resistors may be used in the acceleration/deceleration column 208 to resistively grade the electrodes therein so that fewer power supplies are necessary.

The mass analyzer 210 may include a resolving magnet that deflects ions so that ions of a desired species pass through the rotating slit 212 and undesired species do not pass through the rotating mass slit 212. In one embodiment, the mass analyzer 210 may deflect ions of the desired species by 90 degrees and may deflect ions of undesired species by differing amounts due to their different masses. A scanner 214 positioned downstream from the rotating mass slit 212 may deflect or scan the ion beam in at least one direction at a scan frequency in order to distribute the ion beam over the front surface of the wafer 110. The scanner 204 may be an electrostatic scanner or a magnetic scanner as known to those skilled in the art.

The angle corrector magnet 216 is positioned downstream from the scanner 214 and deflects ions of the desired ion species to convert diverging ion beam paths to nearly collimated ion beam paths having substantially parallel ion trajectories. In one embodiment, the angle corrector magnet 216 may deflect ions of the desired ion species by 45 degrees. The end station (not illustrated) may support one or more wafers in the path of the ion beam 10 such that ions of the desired species are implanted into the wafer 110. The wafer 110 can take various physical shapes such as a common disk shape. The wafer 110 can be a semiconductor wafer fabricated from any type of semiconductor material, such as silicon, or any other material that is to be implanted using the ion beam 10.

The controller 220 may receive input data and instructions from any variety of systems and components of the ion implanter 200 and provide output signals to control the components of the ion implanter 200 such as the charge exchange apparatus 106. For clarity of illustration, the controller 220 is illustrated as only communicating with and controlling the charge exchange apparatus 106. However, those skilled in the art will recognize that the controller 220 may communicate with and control other components of the ion implanter 200. The controller 220 can be or include a general-purpose computer or network of general-purpose computers that may be programmed to perform desired input/output functions. The controller 220 can also include other electronic circuitry or components, such as application specific integrated circuits, other hardwired or programmable electronic devices, discrete element circuits, etc. The controller 220 may also include communication devices, data storage devices, and software.

A user interface system 224 may include, but not be limited to, devices such as touch screens, keyboards, user pointing devices, displays, printers, etc. to allow a user to input commands and/or data and/or to monitor the ion implanter 200 via the controller 220.

FIG. 3 illustrates ion trajectories of ions having differing charge states that are input to the angle corrector magnet 216 of FIG. 2 by the charge exchange apparatus 106. For ease of explanation, an example is given where the ion beam 10 having $P^{+++}$ ions is provided to the charge exchange apparatus 106, and $P^{++}$ ions are desired ions to be provided and directed towards the wafer 110. This example is not limiting as any desired species other than P and other charge states may be selected. In this example, the charge exchange apparatus 106 may also output parasitic beamlets 32, 34, 36 of $P^0$, $P^+$, and $P^{+++}$ ions respectively. Advantageously, the angle corrector magnet 216 is configured to bend the ion beam 10 having desired $P^{++}$ ions towards the target wafer 110 by converting diverging ion beam paths from the scanner 214 to nearly collimated ion beam paths having substantially parallel ion trajectories.

Compared to the ion beam 10 having desired $P^{++}$ ions, the parasitic beamlet 32 of $P^0$ ions will not be bent at all by the angle corrector magnet 216 and will therefore tend to deviate to the "outside" of the target wafer 110 as illustrated in FIG. 3. Also compared to the ion beam 10 having desired $P^{++}$ ions, the parasitic beamlet 34 of $P^+$ ions will be bent less by the magnetic field in the angle corrector magnet 216 and therefore also tend to deviate towards the "outside" of the target wafer 110. Yet another parasitic beamlet 36 of $P^{+++}$ ions will be bent more by the magnetic field in the angle corrector magnet 216 and therefore tend to deviate towards the "inside" of the target wafer 110 as illustrated in FIG. 3. Positioning the target wafer 110 a reasonable distance downstream from the angle corrector magnet 216 will allow enough distance so that the parasitic beamlets 32, 34, 36 do not strike any portion of the wafer 110. There still could be some charge-exchange contamination occurring in the angle corrector magnet 216 that could reach the target wafer 110, but in general this contamination can be reasonably controlled by other mechanisms known to those skilled in the art.

FIG. 4 illustrates one embodiment of a charge exchange apparatus 106 consistent with the disclosure. The charge exchange apparatus 106 may include a chamber 402. A gas source 404 may inject a gas into the chamber 402 via a gas flow controller 406. The gas flow controller 406 regulates the rate at which gas is supplied to the chamber 402. A pump 408 may also be coupled to the chamber 402 through a controllable valve 409. The controller 220 may regulate the gas flow controller 406 and valve 409 to provide a desired pressure within the chamber 402. The gas source 404 may be a canister containing a gas or a vaporizer (not illustrated) containing a solid feed material. The vaporizer may vaporize the solid feed material so that the gaseous form of the feed material may be provided to the chamber 402. The gas may include, but not be limited to, argon, xenon, and nitrogen. Hydrogen may also be selected as the gas. Some electropositive elements such as those in Group I and Group II of the Periodic Table may also be selected as the solid feed material so that the gas input to the chamber 402 may be the gaseous form of such electropositive elements, e.g., cesium (Cs) from Group I or magnesium (Mg) from Group II to name only a couple. The chamber 402 may have an input aperture 410 sized to accept the ion beam 10 and an output aperture 412 sized to provide the ion beam 10 having the desired charge state. The controller 220 may also control the size of the input aperture 410 and output aperture 412 when such apertures have a variable size.

In operation, ions at a first charge state of the ion beam 10 may be input to the chamber 402. The ions may interact with gas molecules of the gas from the gas source 404 so that some of the ions are altered to a second charge state less than the first charge state. In one example, $P^{+++}$ ions may be input to the chamber 402 and be altered to $P^{++}$ ions. The efficiency of the conversion from one charge state to another may be optimized by optimizing the pressure in the chamber 402, the type of gas provided by the gas source 404, and the path length of the chamber 402. In general, increasing the pressure and the path length increases the probability of interactions between the input ions and gas molecules in the chamber 402 resulting in the desired charge state. In addition, a defocusing element 480 may be positioned directly upstream of the input aperture 410 in order to defocus the beam. The defocused ion beam output of the defocusing element 480 may have a larger cross sectional size than the ion beam input to the defocusing element 480 so that the probability of interactions between ions of the ion beam 10 and the gas molecules is further increased. In one embodiment, the defocusing element 480 may be a quadrapole lens as is known in the art. Despite optimization for the desired lower charge state, ions having undesired charge states may also be output from the output aperture 412 as parasitic beamlets. For instance, in addition to the desired $P^{++}$ ions in one example, $P^{+++}$ and $P^+$ ions may be output as associated parasitic beamlets 36, 34. However, as earlier detailed, a deflector 108 such as the angle corrector magnet 216 in one embodiment may direct the parasitic beamlets away from the target wafer 110.

FIG. 5 illustrates an end view of the input end of the chamber 402 of FIG. 4 showing the input aperture 410. The input aperture 410 as well as the output aperture 412 may have a variable size to accommodate different sized ion beams. In one instance, the input aperture 410 may have an approximately circular shape to accept an approximately circular cross-section of a spot ion beam. The controller 220 may be responsive to various inputs representative of the cross sectional size of the ion beam to control the size of the input and output apertures 410, 412 in response thereto so that the size of the apertures 410, 412 are just large enough to pass the expected cross-sectional size of the ion beam. The cross-sectional size of the ion beam entering the input aperture 410 may vary with a kinetic energy of the ions of the ion beam, the particular dopant species, the position of the input aperture 410 relative to other beam-line components, etc. The input and output apertures 410, 412 may be a conductance limiting aperture allowing only a small amount of gas to be used in the chamber 402. In another charge exchange apparatus embodiment positioned post-acceleration and pre-analysis, the beamline conductance may work to contain the gas and control a detrimental rise in the angle corrector magnet pressure. The choice of gas from the gas source, e.g., xenon, would allow good beamline pumping.

Turning to FIG. 6, a flow chart 600 of operations consistent with an embodiment of the disclosure is illustrated. Operation 602 may include generating an ion beam having ions at a first charge state. Operation 604 may include accelerating the ions at the first charge state to a final energy. Operation 606 may include altering the first charge state to a second charge state for some of the ions, the second charge state less than the first charge state. Operation 608 may include providing an ion beam having ions at the second charge state and parasitic beamlets, and operation 610 may include directing the ion beam towards a wafer and the parasitic beamlets away from the wafer.

Advantageously, the energy range of the ion implanter may be extended into high energy ranges using multiply charged ions and contamination may be controlled by converting the multiply charged ions to a lower charge state before ion implantation. Hence, a high energy range with a lower contamination can be achieved. Absent this charge conversion, some parasitic beamlets input to a corrector magnet would still strike a target wafer adversely affecting dose uniformity and profile. By converting the multiply charged ions to a lower charge state, contamination can be better controlled since a deflector such as the angle corrector magnet can sufficiently deflect parasitic beamlets away from the target wafer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter comprising:
   an ion source configured to generate an ion beam having ions at a first charge state;
   an accelerator configured to accelerate said ions at said first charge state to a final energy;
   a charge exchange apparatus positioned downstream of said accelerator, said charge exchange apparatus configured to accept said ion beam and to alter said first charge state to a second charge state for some of said ions, said second charge state less than said first charge state, said charge exchange apparatus further configured to provide said ion beam having ions at said second charge state and parasitic beamlets having ions at a charge state different than said second charge state; and
   a deflector positioned downstream of said charge exchange apparatus, said deflector configured to direct said ion beam having ions at said second charge state towards a wafer and to direct said parasitic beamlets away from said wafer.

2. The ion implanter of claim 1, wherein said first charge state is a triply charged state and said second charge state is a doubly charged state.

3. The ion implanter of claim 1, wherein a species of said ions is phosphorous (P) and said first charge state is $P^{+++}$ and said second charge state is $P^{++}$.

4. The ion implanter of claim 1, wherein said wafer is positioned a distance downstream from said deflector so said parasitic beamlets do not strike any portion of said wafer.

5. The ion implanter of claim 1, wherein said deflector comprises an angle corrector magnet.

6. The ion implanter of claim 1, wherein said charge exchange apparatus comprises a chamber, said chamber configured to accept a gas from a gas source, said chamber also having an input aperture to accept said ion beam having ions at said first charge state and an output aperture to provide said ion beam having ions at said second charge state and said parasitic beamlets, wherein said ions at said first charge state interact with gas molecules of said gas in said chamber to produce ions at said second charge state and said parasitic beamlets.

7. The ion implanter of claim 6, wherein said input and output apertures have a variable size.

8. The ion implanter of claim 6, further comprising a defocusing element positioned immediately upstream of said input aperture, said defocusing element configured to defocus said ion beam to increase a cross sectional size of said ion beam in order to increase a probability of interactions of said ions at said first charge state with said gas molecules in said chamber.

9. The ion implanter of claim 6, wherein said gas is selected from a group consisting of argon, xenon, and nitrogen.

10. The ion implanter of claim 6, wherein said gas is selected from a group consisting of Group I and Group II elements of the Periodic Table.

11. A method comprising:
    generating an ion beam having ions at a first charge state;
    accelerating said ions at said first charge state to a final energy;
    altering said first charge state to a second charge state for some of said ions, said second charge state less than said first charge state;
    providing an ion beam having ions at said second charge state and parasitic beamlets having ions at a charge state different than said second charge state;
    directing said ion beam having ions at said second charge state towards a wafer; and
    directing said parasitic beamlets away from said wafer.

12. The method of claim 11, wherein said first charge state is a triply charged state and said second charge state is a doubly charged state.

13. The method of claim 11, wherein a species of said ions is phosphorous (P) and said first charge state is $P^{+++}$ and said second charge state is $P^{++}$.

14. The method of claim 11, further comprising positioning said wafer so said parasitic beamlets do not strike any portion of said wafer.

15. The method of claim 11, wherein said altering of said first charge state to said second charge state occurs in a chamber, said chamber configured to accept a gas from a gas source, said chamber also having an input aperture to accept said ion beam having ions at said first charge state and an output aperture to provide said ion beam having ions at said second charge state and said parasitic beamlets, wherein said ions at said first charge state interact with gas molecules of said gas in said chamber to produce ions at said second charge state and said parasitic beamlets.

16. The method of claim 15, wherein said gas is selected from a group consisting of Group I and Group II elements of the Periodic Table.

17. The method of claim 15, further comprising defocusing said ion beam directly upstream of said input aperture to increase a cross sectional size of said ion beam in order to increase a probability of interactions of said ions at said first charge state with said gas molecules in said chamber.

* * * * *